(12) United States Patent
Gavney, Jr.

(10) Patent No.: US 7,739,768 B2
(45) Date of Patent: *Jun. 22, 2010

(54) SQUEEGEE DEVICE AND SYSTEM WITH INTEGRATED SPONGE ELEMENTS

(76) Inventor: James A. Gavney, Jr., 725 Wildwood La., Palo Alto, CA (US) 94303

( * ) Notice: Subject to any disclaimer, the term of this patent is extended or adjusted under 35 U.S.C. 154(b) by 0 days.

This patent is subject to a terminal disclaimer.

(21) Appl. No.: 11/635,185

(22) Filed: Dec. 5, 2006

(65) Prior Publication Data

US 2007/0074361 A1    Apr. 5, 2007

Related U.S. Application Data

(63) Continuation of application No. 11/122,684, filed on May 4, 2005, which is a continuation-in-part of application No. 10/705,150, filed on Nov. 10, 2003, now abandoned.

(60) Provisional application No. 60/424,855, filed on Nov. 9, 2002, provisional application No. 60/424,856, filed on Nov. 9, 2002.

(51) Int. Cl.
*A47L 13/00* (2006.01)
(52) U.S. Cl. .................... 15/121; 15/245; 15/244.4
(58) Field of Classification Search ............ 15/121, 15/244.1, 244.4, 245
See application file for complete search history.

(56) References Cited

U.S. PATENT DOCUMENTS

| 66,834 A | 7/1867 | Harlan | |
|---|---|---|---|
| 104,886 A | 6/1870 | Rhodehamel | |
| 208,851 A | 10/1878 | Riffe | |
| 2,280,751 A | 4/1942 | Davis | 15/158 |
| 2,334,796 A | 11/1943 | Steinmetz et al. | 15/121 |
| 2,516,491 A | 7/1950 | Swastek | 15/188 |
| 2,518,765 A | 8/1950 | Ecker | 15/115 |
| 2,534,086 A | 12/1950 | Vosbikian et al. | 15/245 |
| 2,587,382 A | 2/1952 | Pyne | 15/136 |
| 2,631,326 A * | 3/1953 | Smith, Jr. | 15/364 |
| 2,644,974 A | 7/1953 | Anderson | 15/121 |
| 2,678,458 A | 5/1954 | Vosbikian et al. | 15/116 |
| 2,715,745 A | 8/1955 | Jacobsen | 15/121 |
| 2,819,482 A | 1/1958 | Applegate | 15/110 |

(Continued)

FOREIGN PATENT DOCUMENTS

FR    2 636 818    3/1990

(Continued)

*Primary Examiner*—Shay L Karls
(74) *Attorney, Agent, or Firm*—Jag Patent Services LLC

(57) ABSTRACT

A device with a squeegee configuration and an absorbent material positioned between protruding squeegee walls for treating a working surface with wiping edges of the squeegee configuration and the absorbent material is disclosed. A device, in accordance with the invention, comprises a curved squeegee and means for coupling the curved squeegee to a spray nozzle for wiping the working surface with edges of the curved squeegee and spray the working surface with the spray nozzle. A system, in accordance with the invention, comprises a vacuum source, a liquid source and an applicator head with squeegees and apertures wherein a portion the apertures are configured to couple the vacuum source and draw a vacuum on a working surface and a second portion of the apertures are configured to couple to the liquid source and deliver a liquid to the working surface.

5 Claims, 17 Drawing Sheets

U.S. PATENT DOCUMENTS

| | | | | |
|---|---|---|---|---|
| 2,946,072 | A | 7/1960 | Filler et al. | 15/110 |
| 3,008,160 | A | 11/1961 | West | 15/1.7 |
| 3,010,420 | A | 11/1961 | Glynn | 114/222 |
| 3,069,716 | A | 12/1962 | Smith | 15/371 |
| 3,085,267 | A | 4/1963 | Jacuzzi | 15/1.7 |
| 3,110,052 | A | 11/1963 | Whitman | 15/117 |
| 3,181,193 | A | 5/1965 | Nobles et al. | 15/114 |
| 3,273,187 | A | 9/1966 | Williams | 15/1.7 |
| 3,491,396 | A | 1/1970 | Eannarino et al. | 15/104.94 |
| 3,563,233 | A | 2/1971 | Bodine | 128/36 |
| 3,631,561 | A * | 1/1972 | Aszkenas | 15/250.41 |
| 3,638,270 | A | 2/1972 | Schlegel, Jr. et al. | 15/114 |
| 3,641,610 | A | 2/1972 | Lewis, Jr. | 15/114 |
| 3,656,202 | A | 4/1972 | Paton | 15/121 |
| 3,707,737 | A | 1/1973 | Brower | 15/1.7 |
| 3,992,747 | A | 11/1976 | Hufton | 15/321 |
| 4,407,213 | A | 10/1983 | Evans | 114/222 |
| 4,498,206 | A | 2/1985 | Braukmann | 15/1.7 |
| 4,607,411 | A | 8/1986 | Lewis, Jr. | 15/117 |
| 4,763,380 | A | 8/1988 | Sandvick | 15/160 |
| 4,812,070 | A | 3/1989 | Marty | 401/289 |
| 4,847,940 | A | 7/1989 | Bradbury | 15/250.4 |
| 4,913,133 | A | 4/1990 | Tichy | 128/62 |
| 5,040,260 | A | 8/1991 | Michaels | 15/167.1 |
| 5,052,840 | A | 10/1991 | St. Cyer | 401/201 |
| 5,152,026 | A | 10/1992 | Scarpine | 15/1.7 |
| 5,249,327 | A | 10/1993 | Hing | 15/104.94 |
| 5,289,605 | A | 3/1994 | Armbruster | 15/97.1 |
| 5,317,776 | A | 6/1994 | DeMoura | 15/1.7 |
| 5,386,607 | A | 2/1995 | Sebor | 15/1.7 |
| 5,429,678 | A | 7/1995 | Fany | 134/6 |
| RE35,033 | E | 9/1995 | Waldhauser | 15/320 |
| 5,491,863 | A | 2/1996 | Dunn | 15/106 |
| 5,528,793 | A | 6/1996 | Schbot | 15/245 |
| 5,735,011 | A | 4/1998 | Asher | 15/167.1 |
| 6,000,088 | A | 12/1999 | Wright et al. | 15/119.2 |
| 6,003,187 | A | 12/1999 | Footer et al. | 15/119.2 |
| 6,065,182 | A | 5/2000 | Wright et al. | 15/353 |
| 6,065,890 | A | 5/2000 | Weitz | 401/146 |
| 6,092,255 | A | 7/2000 | Kim | 15/121 |
| 6,182,323 | B1 | 2/2001 | Bahten | 15/230.16 |
| 6,240,590 | B1 | 6/2001 | Nesbit | 15/210.1 |
| 6,319,332 | B1 | 11/2001 | Gavney, Jr. et al. | 134/6 |
| 6,421,867 | B1 | 7/2002 | Weihrauch | 15/28 |
| 6,463,619 | B2 | 10/2002 | Gavney, Jr. | 15/117 |
| 6,571,417 | B1 | 6/2003 | Gavney, Jr. et al. | 15/117 |
| 6,658,688 | B2 | 12/2003 | Gavney, Jr. | 15/117 |
| 6,659,768 | B1 * | 12/2003 | Ito et al. | 433/95 |
| 6,668,418 | B2 | 12/2003 | Bastien | 15/245 |
| 6,820,299 | B2 | 11/2004 | Gavney, Jr. | 15/117 |
| 6,820,300 | B2 | 11/2004 | Gavney, Jr. | 15/117 |
| 6,996,870 | B2 | 2/2006 | Hohlbein | 15/110 |
| 2001/0039689 | A1 | 11/2001 | Gavney, Jr. | 15/117 |
| 2005/0049155 | A1 | 3/2005 | Gavney, Jr. et al. | 510/108 |
| 2005/0198757 | A1 * | 9/2005 | Gavney et al. | 15/114 |
| 2007/0033755 | A1 * | 2/2007 | Gavney, Jr. | 15/121 |

FOREIGN PATENT DOCUMENTS

FR            2793136 A1 * 11/2000

* cited by examiner

SQUEEGEE DEVICE AND SYSTEM WITH INTEGRATED SPONGE ELEMENTS

RELATED APPLICATIONS

This Patent Application is a Continuation of the co-pending patent application Ser. No. 11/122,684, filed May 4, 2005, titled "ABSORBENT STRUCTURES WITH INTEGRATED WIPING ELEMENTS", which is a Continuation-in-Part Application of the patent application Ser. No. 10/705,150, filed Nov. 10, 2003 now abandoned, titled "SQUEEGEE DEVICE AND SYSTEM". The patent application Ser. No. 10/705,150 filed Nov. 10, 2003, titled "SQUEEGEE DEVICE AND SYSTEM" claims priority under 35 U.S.C. 119 (e) of the U.S. Provisional Patent Application Ser. No. 60/424,855, filed Nov. 9, 2002, and titled "SQUEEGEE DEVICE AND SYSTEM" and the Provisional Patent Application Ser. No. 60/424,856, also filed Nov. 9, 2002, and also titled "SQUEEGEE DEVICE AND SYSTEM". The patent application Ser. No. 11/122,684, filed May 4, 2005, titled "ABSORBENT STRUCTURES WITH INTEGRATED WIPING ELEMENTS", the patent application Ser. No. 10/705,150, filed Nov. 10, 2003, titled SQUEEGEE DEVICE AND SYSTEM", the U.S. Provisional Patent Application Ser. No. 60/424,855, filed Nov. 11, 2002, and titled "SQUEEGEE DEVICE AND SYSTEM" and the U.S. Provisional Patent Application Ser. No. 60/424,856, also filed Nov. 9, 2002, and also titled "SQUEEGEE DEVICE AND SYSTEM" are all hereby incorporated by reference.

FIELD OF THE INVENTION

This invention relates generally to cleaning devices and cleaning systems. More specifically the invention relates to cleaning devices and cleaning systems that clean surfaces through contact.

BACKGROUND

Treating surfaces is an activity that occupies a considerable portion of most peoples time. For example, household surfaces are regularly cleaned and polished and/or require the application of treatment or cleaning materials to the household surfaces. Also, many industrial processes, such as cleaning floors and polishing wafers, require contacting surfaces to clean the surfaces and/or apply materials to the surfaces. Likewise, there are a number of medical and/or personal hygiene activities that require treating surfaces with contact elements to treat or clean the surfaces. A particular example is oral-care, which requires very specialized treatment of a surface in cleaning teeth and gums.

There are a number of different systems and devices, both manual and electric, that are available for cleaning teeth and gums. A number of these available systems and devices are inefficient at cleaning teeth and gums and require multiple pass scrubbing with oral cleaning agents, such as tooth pastes or gels, to effectively clean the teeth and gums. Typically, toothbrushes, for example, do not efficiently apply the oral cleaning agents to the teeth and gums and can be abrasive, causing loss of healthy gum tissue and/or damage to teeth. Further, toothbrushes can require a high degree of technique and/or dexterity to be used effectively for cleaning teeth and gums.

There are also number of different systems and devices for cleaning tissues or irrigating tissues in a clinical environment. For example dentists use a water nozzle and vacuum nozzle to irrigate an oral cavity during dental procedure. While treating open wounds, either as a result of an accident or during a surgical procedure, swabs, gauze and or vacuum devices can be used. To provide sterile washing solution, typically a water source is sprayed or pored over the wound. Such systems and devices for cleaning or irrigating tissues are difficult to control and can result in splashing and dissemination of unwanted solution and/or body fluids.

What is needed is a dentition cleaning system and device that can efficiently apply oral cleaning agents to teeth and gums and that can clean teeth and gums without a high degree of technique or dexterity. Further, what is needed is a dentition cleaning system and device that is less abrasive to teeth and gums than a conventional bristle toothbrush.

SUMMARY OF THE INVENTION

The invention is a device, system and method for treating a working surface. Preferably, the device of the invention is configured to apply a vacuum and/or delivery a liquid to the working surface. The device of the instant invention has a squeegee configuration comprising one or more apertures. The squeegee configuration comprises elongated squeegee walls that protrude from at least two locations. Preferably the one or more apertures are positioned between the elongated squeegee walls such that the vacuum or liquid is delivered to the working surface between the elongated squeegee walls. The squeegee configuration is preferably configured to couple to a source for providing the vacuum or liquid to working surface through the one or more apertures.

The present invention is directed to a device comprising head that is configured to clean surfaces, treat surfaces and/or apply materials to surfaces. Preferably, the head is a cleaning head that is configured to clean and/or treat teeth and gums. However, it will be clear to one skilled in the art that the present invention can equally be applied to devices that are configured to clean any number of different surfaces including, but not limited to floors, cars, wafers and/or appliances.

In accordance with the present invention, a device comprises a cleaning head with two or more regions, wherein at least one of the regions preferably comprises a squeegee element configured to treat a working surface and at least one of the regions comprises bristles. In accordance with a preferred embodiment of the invention, at least one of the regions is configured to move independently of another of the regions. To move independently, herein, means that one of the regions is stationary while another region moves or that the regions move separately from the other, but does not necessarily mean that the regions are not synchronized to move with a similar or the same motion or that the regions are not coupled to the same mechanism to drive the motion of the regions. Preferably, one or more of the regions are configured to vibrate, rotate, oscillate or otherwise automatically move relative to and independently from another of the regions. In accordance with further embodiments of the invention two or more of the regions comprises bristle and squeegee elements. In still further embodiments of the invention, one or more of the regions of the cleaning head comprises nodules, i.e resilient protrusions with any number of different geometries such as described below and further described in U.S. patent application Ser. No. 09/957,302, filed Sep. 19, 2001 and titled "DEVICE WITH MULTI-STRUCTURAL CONTACT ELEMENTS," the contents of which are hereby incorporated by reference.

The squeegee elements utilized in the present invention can have any number of different geometries including curved, rounded angled, corrugated, pointed and/or textured walls and/or wiping edges. Squeegee elements can include squeegee segments with one or more terminus ends and/or squeegee segments that form matrices of squeegee compartments and continuous squeegee segments that encircle portions of regions. Squeegees utilized in the present invention can be formed from any number of different materials, but are preferably formed from a resilient polymeric material such as silicon, latex, rubber, polyurethane or a combination thereof. Preferably, squeegees, or a portion thereof, are formed from a material, or materials, that can be molded and that result in squeegees elements with hardness values in a range of 10 to 100 Shores A, as defined in the D2240-00 Standard Test Method for Rubber Property-Duromter Hardness, published by the American Society for Testing Materials, the contents of which are hereby incorporated by reference. Additional details of squeegee configurations are provided in the U.S. Pat. No. 6,319,332, filed Jun. 11, 1999, titled "SQUEEGEE DEVICE AND SYSTEM," and U.S. Pat. No. 6,571,417, filed Jun. 5, 2000, titled "DENTITION CLEANING DEVICE AND SYSTEM," the contents of which are also both hereby incorporated by reference.

Squeegees, in accordance with still further embodiments of the present invention, include an abrasive material that is integrated with the material(s) used to form the squeegees and/or are applied to surfaces of squeegee walls and/or edges after they are formed. Methods and materials for making molded abrasive structures are described in U.S. Pat. No. 6,126,533, and titled "MOLDED ABRASIVE BRUSH", the contents of which are hereby incorporated by reference.

In accordance with a preferred embodiment of the invention, a squeegee element comprises an elongated squeegee segments with smaller fins that protrude from walls of the elongated squeegee segment and provide top wiping edges and side wiping edges, such as described in detail in U.S. patent application Ser. No. 10/454,281, filed Jun. 3, 2003, entitled "MULTI-DIRECTIONAL WIPING ELEMENTS AND DEVICES USING THE SAME", the contents of which are hereby incorporated by reference.

The elongated squeegee walls are preferably formed from a resilient flexible material such as silicone, latex, rubber and polyurethane. The resilient flexible material preferably has a durometer hardness values between 10 and 90 Shore (A) as defined by procedure in D2240-00 "Standard Test method Ruber Property-Durometer Hardness", developed by the American Society for Testing and Materials, the contents of which is hereby incorporated by reference. The elongated squeegee walls can protrude to any distance, but preferably they protrude by a distance of 1.0 cm or greater form a support member and have squeegee wall thicknesses of 1.0 mm or greater.

The protruding squeegee edge and/or the elongated squeegee walls are smooth or contoured. Contoured squeegee have any number of patterns and provides any number of textures suitable for the application at hand. Further, the squeegee support is flat support or a contoured. In accordance with an embodiment of the instant invention, squeegee segments are elongated in at least two non-parallel directions. In yet further embodiments of the instant invention, squeegee segments of protrude in two non-parallel protruding directions.

The squeegee configuration comprise any number of simple of complex arrangement of squeegee segments or members including groupings of linear or cured squeegee segments, continuous squeegees, spiral squeegee , matrices or arrays of squeegees or any combination thereof.

According to a preferred embodiment, the squeegee configuration has at least to squeegee segments that boundary a squeegee compartment, wherein one or more apertures are positioned between the squeegee walls of squeegee segments that boundary the squeegee compartment.

Alternative embodiments of the invention further comprise a contact element such as a sponge, a grouping or groupings of bristles and/or an abrasive or scouring element formed from plastic or steel fibers. Preferably, the contact element is positioned between the elongated squeegee walls of the squeegee configuration.

A device in accordance with the embodiments of the invention comprises a squeegee configuration with squeegee segments having protruding squeegee walls and an absorbent material positioned between the protruding squeegee walls, such that wiping edges of the one or more of the squeegee segments and the absorbent material are configured to treat a working surface.

In accordance with further embodiments of the invention, a device comprises a curved squeegee and means for coupling the curved squeegee to a spray nozzle for wiping the working surface with edges of the curved squeegee and spray the working surface with the spray nozzle. Preferably, that curved squeegee is configured to surround a spraying end of the spray nozzle while coupled thereto. The device, can also include bristles and/or a scouring or abrasive element that can be configured to surround the spraying end of the spray nozzle while coupled thereto.

A system, in accordance with the embodiments of the invention, comprises a vacuum source, a liquid source and an applicator head. The applicator head comprising squeegee configuration with apertures wherein a first portion of the apertures are configured to couple the vacuum source and draw a vacuum on a working surface and a second portion of the apertures are configured to couple to the liquid source and deliver a liquid to the working surface. The applicator head can also comprise bristle and/or a scouring or abrasive element. In accordance with a preferred embodiment of the invention, the squeegee configuration comprises one or more curved squeegee segments, such as a spiraling squeegee element, and is configured to rotate and/or otherwise move while in contact with the working surface.

The current invention is particularly well suited for cleaning surfaces and or apply materials to surfaces. The invention also has application for cleaning or treated submersed surfaces such as pool surfaces, boat surface and the like. The instant invention is also well suited for oral irrigation of teeth and gums or for the treatment of wounds and incisions during a medial procedure. Other applications of the instant invention be apparent form the ensuing detailed description.

DETAILED DESCRIPTION OF THE INVENTION

Figure 1A:
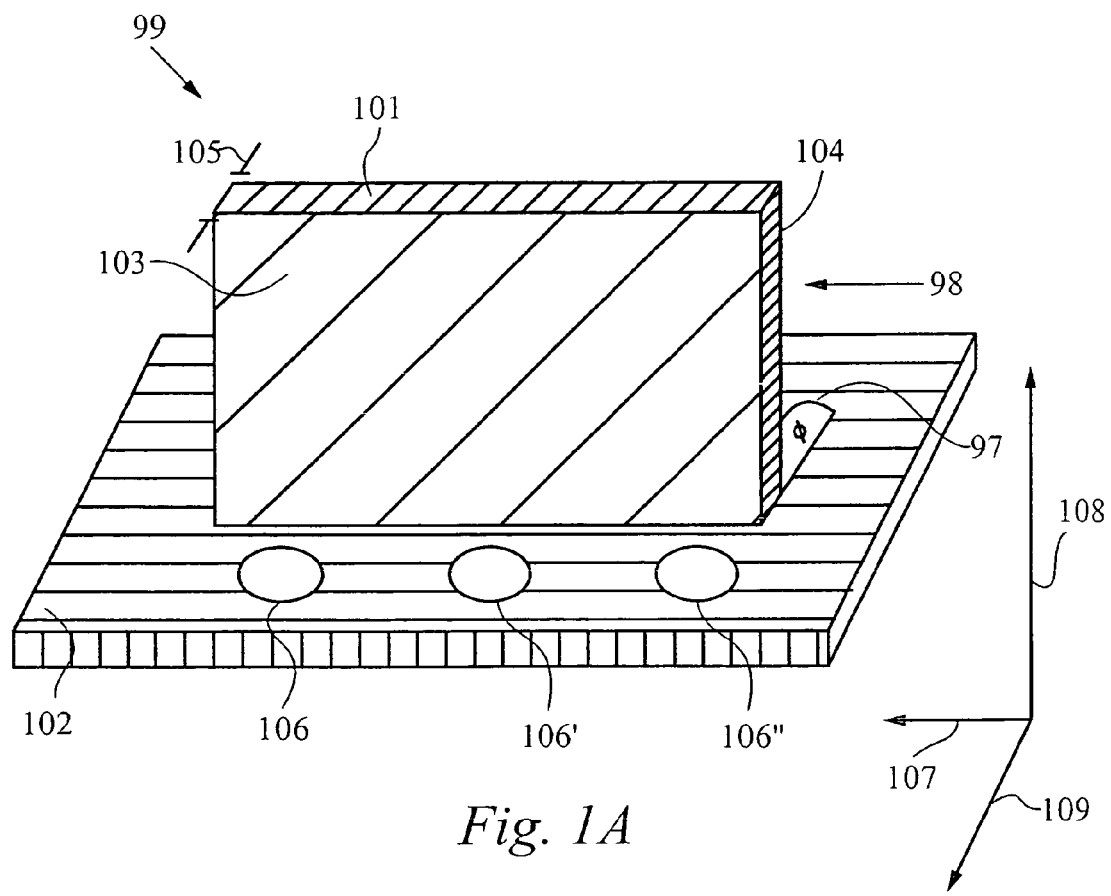
FIGS. 1A-B show a linear squeegee segment and a curved squeegee segment protruding from a support structure with a plurality of apertures, respectively, in accordance with the embodiments of the invention.

FIG. 1A shows a perspective view of a squeegee structure 99 with a squeegee member 98 that protrudes from a support member 102 in a protruding direction 108. In accordance with the embodiments of the invention, the support structure 102 comprises a plurality of apertures 106, 106' and 106" for delivering a medium to and/or for drawing a vacuum on a working surface (not shown) while the squeegee member 98 simultaneously wipes the working surface. The squeegee member 98 has a protruding edge 101 that contacts a surface during a cleaning operation. The squeegee member 98 is elongated in an elongation direction 107 with two elongated squeegee walls 103/104. At any point on the surface of the squeegee walls 103/104, the squeegee member 98 has a squeegee wall thickness 105. The primary squeegee direction 109 is defined, herein, as a direction that is normal to the elongation direction 107. Thus, the linear elongated squeegee 98 provides for one primary squeegee direction, regardless of the protruding angle 97 or curvature of the squeegee wall in the protruding direction 108. For clarity and descriptive purpose, squeegee members and squeegee supports are usually described as separated elements. However, it is clear that squeegee members and squeegee supports may be a singular element and made of the same material. Further, the shapes of supports are not limited to circles or squares generally used, herein, for descriptive purposes; a squeegee support may take any shape or form that is reasonable for the application at hand.

Figure 1B:
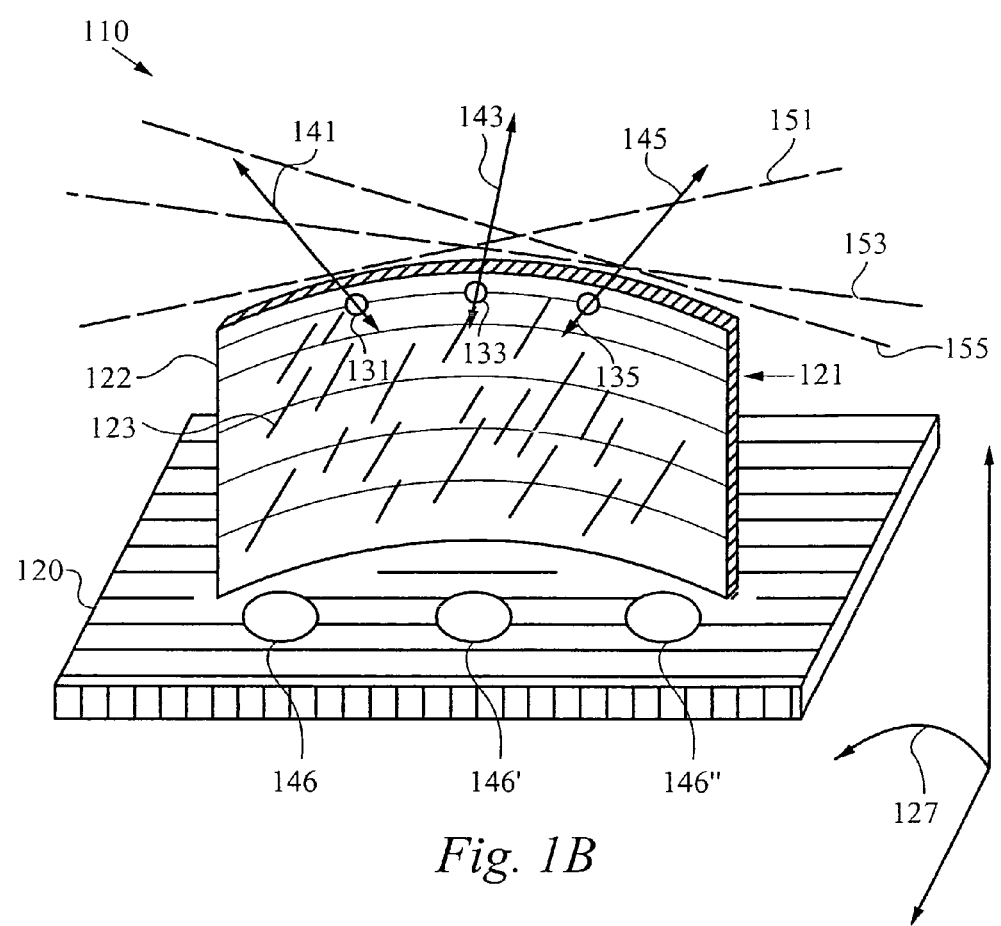

FIG. 1B illustrates a squeegee structure 110 with a curved squeegee member 121 that is curved in the elongation directions 127 and protrudes form a support structure 120. The In accordance with the embodiments of the invention, the support structure 120 comprises a plurality of apertures 146, 146' and 146" for delivering a medium to and/or for drawing a vacuum on a working surface (not shown) while the squeegee structure 99 simultaneously wipes the working surface. Curved squeegee members, such as 121 are particularly useful in the current invention. Geometric considerations will reveal that each point on the curved squeegee wall 122/123 corresponds to a primary squeegee direction in the direction that is normal to a tangent line of the squeegee curvature. For example points 131, 133 and 135 have tangent lines of curvature 151, 153 and 155, respectively, and the corresponding primary squeegee directions 141, 143 and 145.

Figure 1C:
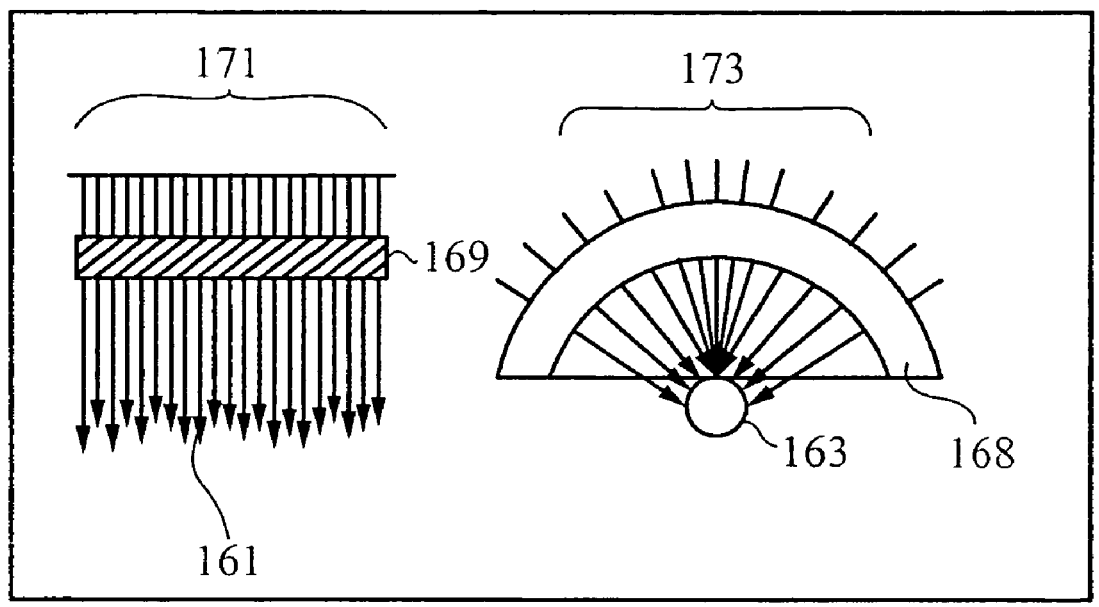
FIG. 1C compares wiping direction provided by linear and curved squeegee segments.

FIG. 1C compares the primary squeegee directions provided by the linear squeegee member of FIG. 1A and the curved squeegee member of FIG. 1B. It can be seen from FIG. 1C, that the curved squeegee member 168 can be moved in a set of directions 173 to contact a single point 163 with a primary squeegee action. While the linear squeegee 169 can only be moved in one direction 171 to contact a point 161 in a primary squeegee direction.

Figure 2A:
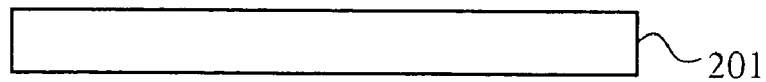
FIGS. 2A-D show geometries of apertures, in accordance with the embodiments of the invention.
Figure 2B:
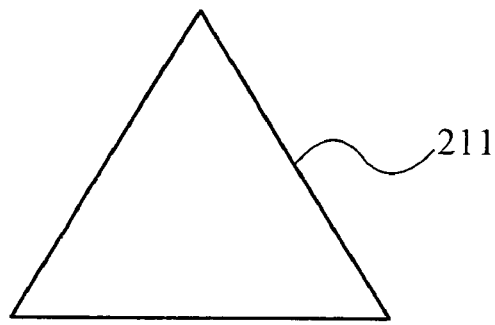
Figure 2C:
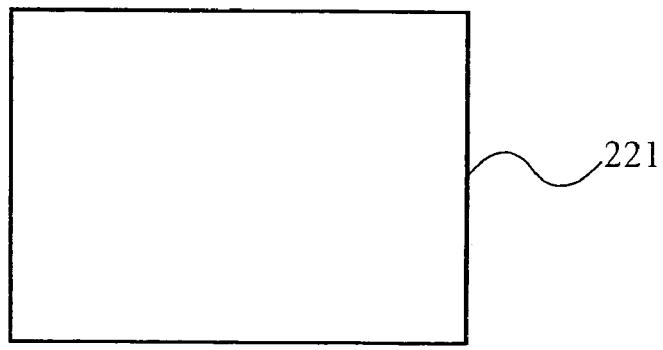
Figure 2D:
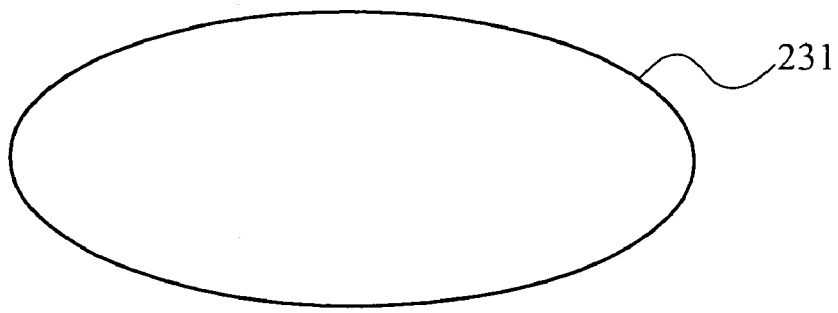

FIGS. 2A-D show geometries of apertures, in accordance with the embodiments of the invention. FIG. 2A shows and elongated rectangular aperture; FIG. 2B shows a triangular aperture; FIG. 2C shows a square aperture; FIG. 2D shows elongated oval aperture. While apertures herein are generally shown as round, it will be understood from the descriptions above and below that systems and devices, in accordance with the embodiments of the invention, can have any number of geometries and combinations of geometries and that the geometries or combination of geometries chosen for the apertures will depend on the intended application.

Figure 3A:
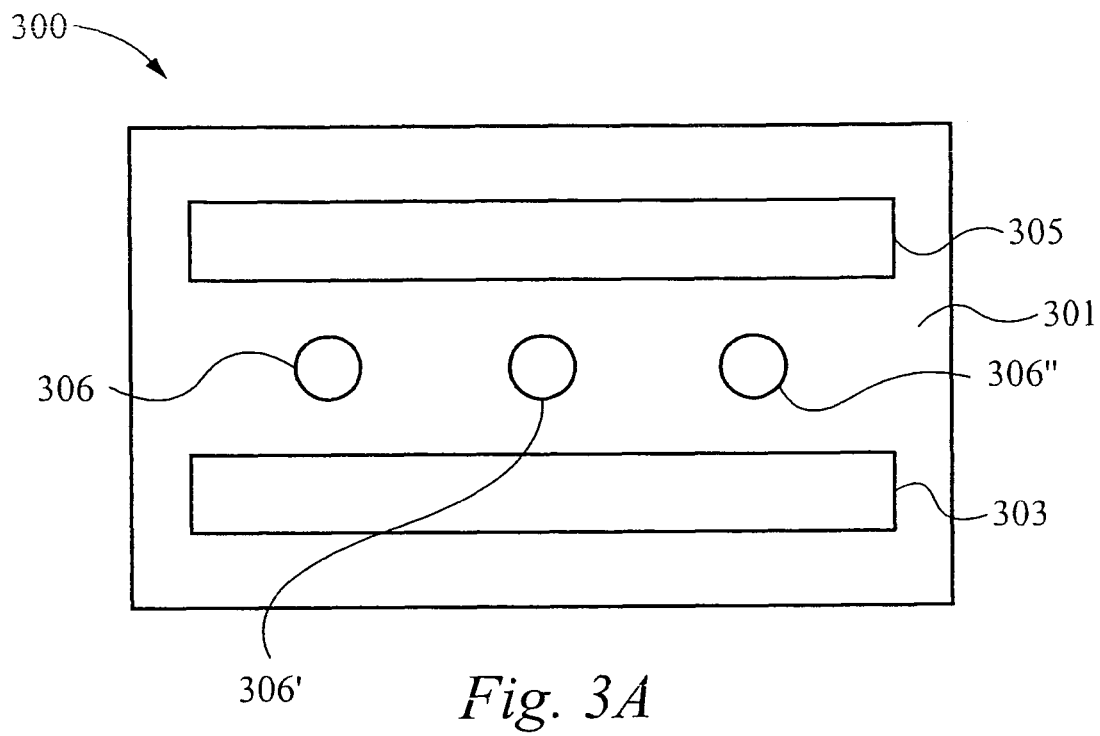
FIGS. 3A-D show squeegee configurations with squeegee walls that surround or flank a plurality of apertures, in accordance with the embodiments of the invention.
Figure 3B:
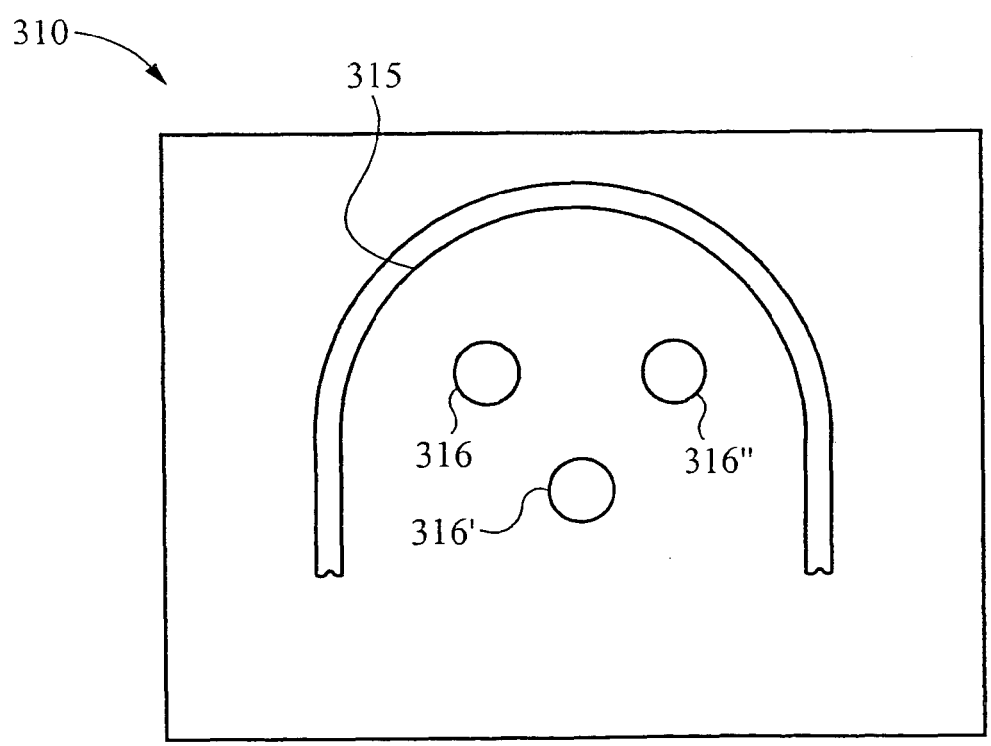
Figure 3C:
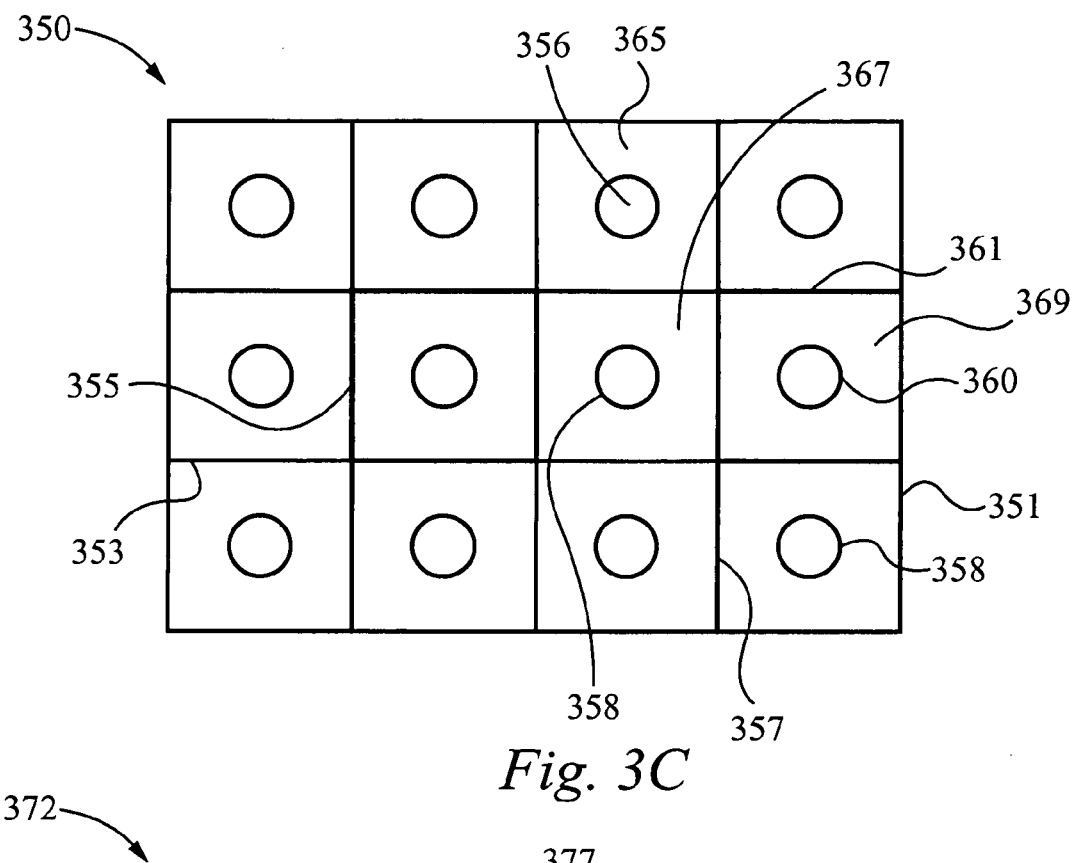
Figure 3D:
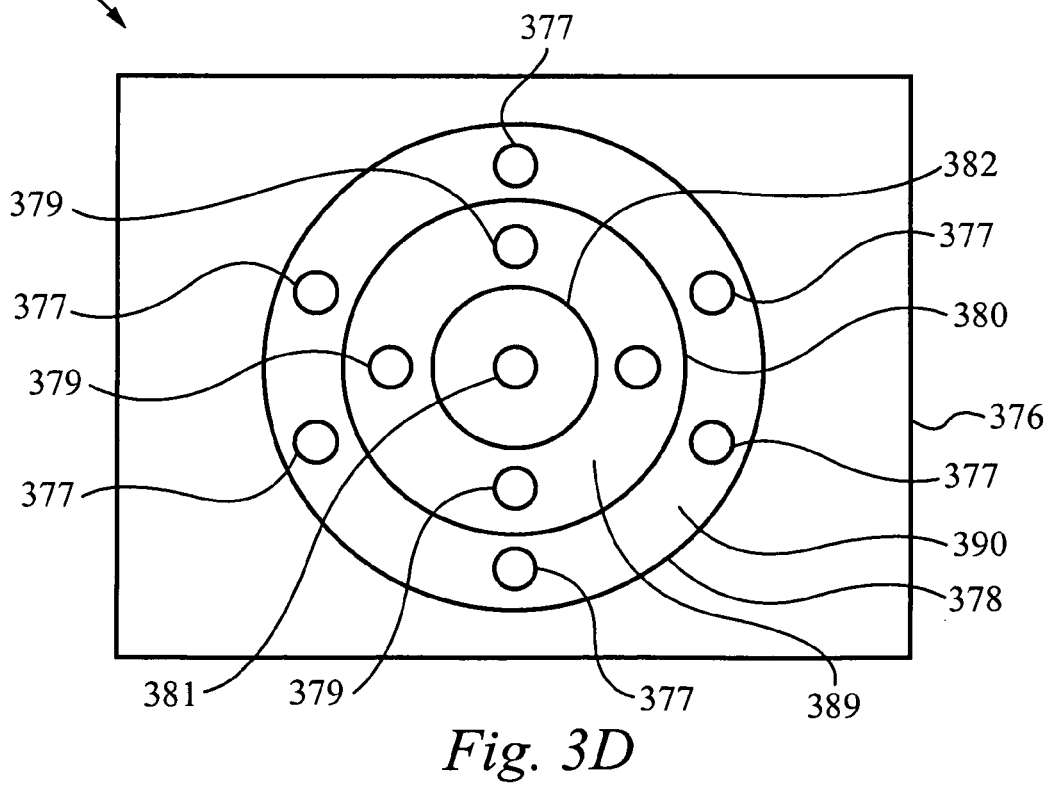

FIGS. 3A-G show squeegee configurations with squeegee walls that surround or flank one or more apertures, in accordance with the embodiments of the invention. FIG. 3A shows a squeegee configuration 300 with a plurality of linear squeegee segments 303 and 305 that protrude from a support structure 301. The support structure 301 has a plurality of aperture 306, 306' and 306" configured for delivering a medium to and/or for drawing a vacuum on a working surface (not shown) while the squeegee segments 303 and 305 wipe the working surface. FIG. 3B shows a squeegee configuration 310 with a curved squeegee segment 315 that protrudes from a support structure 311. The support structure 311 has a plurality of aperture 316, 316' and 316" configured for delivering a medium to and/or for drawing a vacuum on a working surface (not shown) while the curved squeegee segment 315 wipes the working surface. FIG. 3C shows a squeegee configuration 350 with intersecting squeegee segments 353, 355, 357 and 361 that protrude from a support structure 351 and form a network of squeegee compartments 365, 367 and 369. The support structure 351 has a plurality of apertures 356, 358 and 360 that are flanked or surrounded by portions of the squeegee intersecting squeegee segments 353, 355, 357 and 361, such that one or more of the squeegee compartments 365, 367 and 369 have corresponding apertures 356, 358 and 360. The aperture 356, 358 and 360 are preferably configured for delivering a medium to and/or for drawing a vacuum on a working surface (not shown) while the squeegee segments 353, 355, 357 and 361 wipe the working surface. FIG. 3D shows a squeegee configuration 372 with a set of continuous squeegee segments 378, 380 and 382 that protrude from a support structure 376 and from squeegee channels 389 and 390. The support structure 351 has a plurality of apertures 387, 389 and 381 that are surrounded by portions of the continuous squeegee segments 378, 380 and 382 such that one or more of the squeegee channels 389 and 390 have corresponding apertures 387 and 389. The apertures 387, 389 and 381 are preferably configured for delivering a medium to and/or for drawing a vacuum on a working surface (not shown) while the squeegee segments 378, 380 and 382 wipe the working surface.

Figure 4A:
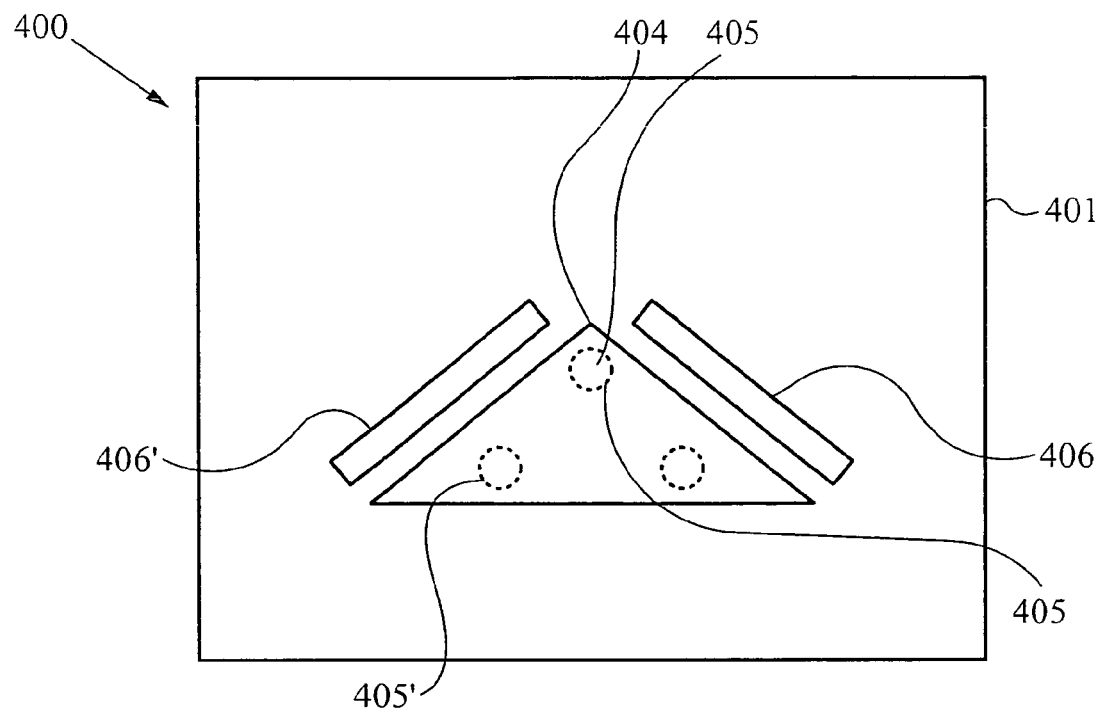
FIGS. 4A-C show squeegee configurations with squeegee walls that surround or flank one or more apertures and one or more sponge elements, in accordance with further embodiments of the invention.
Figure 4B:
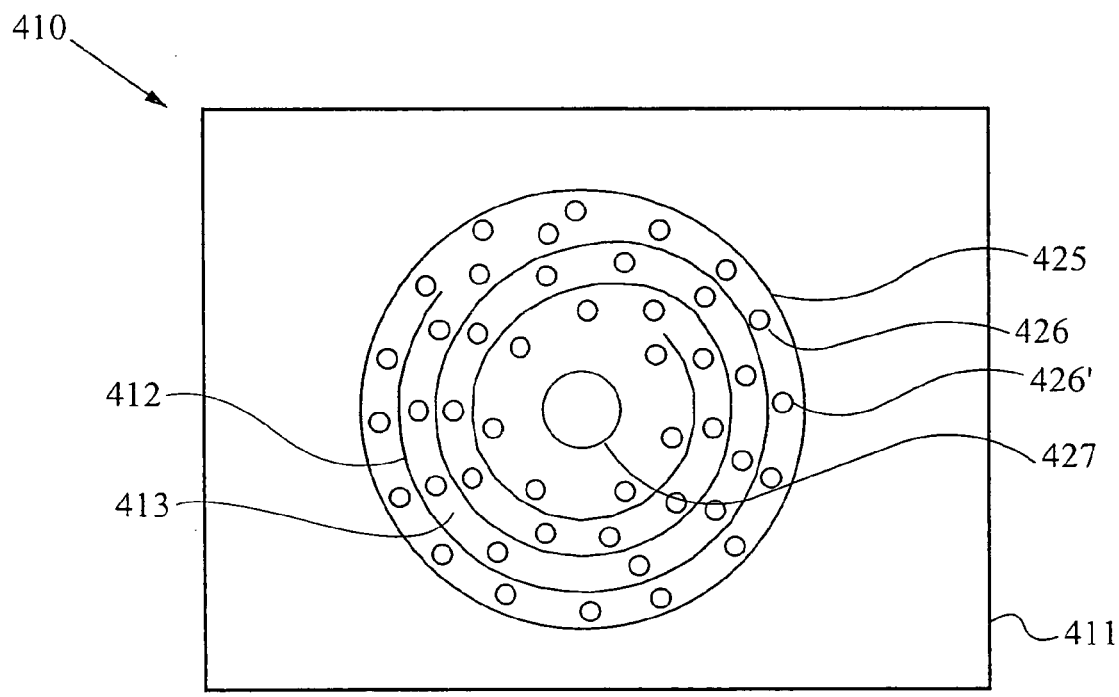
Figure 4C:
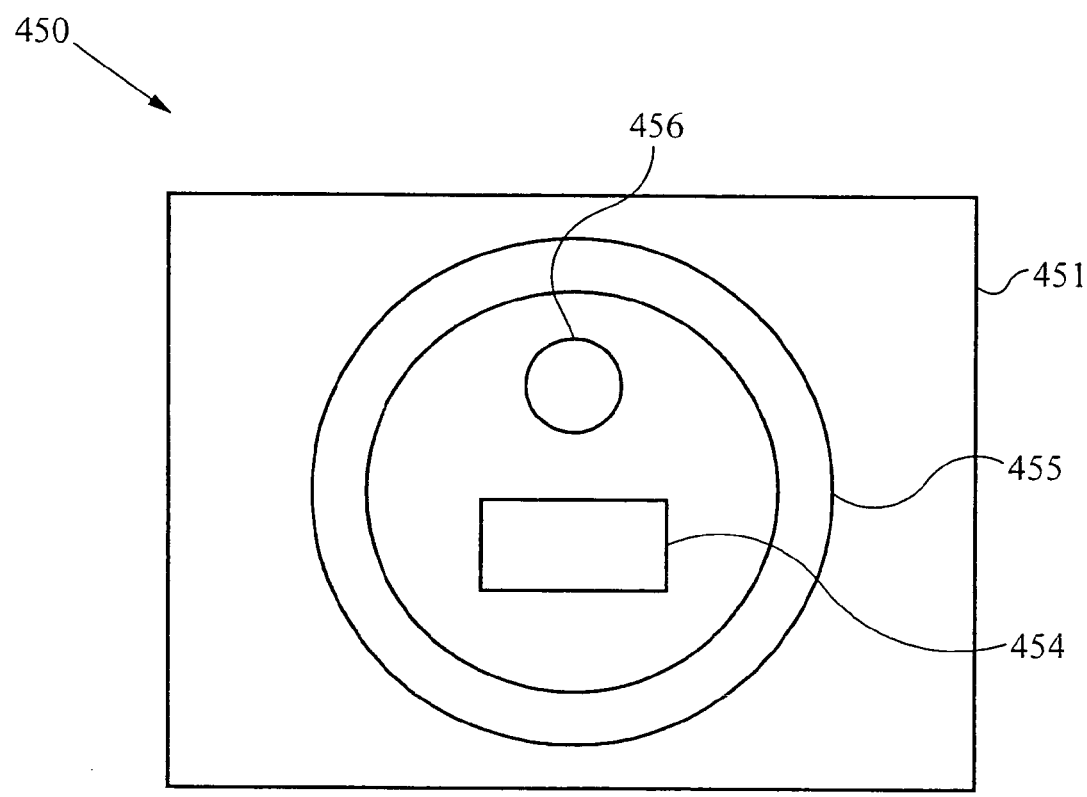

FIGS. 4A-C show squeegee configurations with squeegee walls that surround or flank one or more apertures and one or more sponge elements, in accordance with further embodiments of the invention. FIG. 4A shows a squeegee configuration 400 with a plurality of linear squeegee segments 406 and 406' that protrude from a support structure 401. The support structure 401 has a plurality of apertures 405, 405' and 405" configured for delivering a medium to and/or for drawing a vacuum on a working surface (not shown) while the squeegee segments 406 and 406' wipe the working surface. The squeegee configuration 400 also preferably comprises an absorbent element 404, such as a sponge, that is positioned over one or more of the apertures 405, 405' and 405" and the medium is delivered to and/or the vacuum is drawn on a working surface through the absorbent element 404. FIG. 4B shows a squeegee configuration 410 that includes a spiraling squeegee segment 412 that protrudes from a support structure 411 and forms a squeegee channel 413. The squeegee configuration 410 also preferably has a plurality of apertures 426 and 426' at least a portion of which are positioned in the squeegee channel 413 and which are configured for delivering a medium to and/or for drawing a vacuum on a working surface (not shown) while the spiraling squeegee segment 412 wipes the working surface. The squeegee configuration 410 also preferably comprises an absorbent element 427, such as a sponge, that can be positioned in the middle of the spiraling squeegee 411, as shown, and/or can be positioned within the squeegee channel 413 and over one or more of the plurality of apertures 426 and 426', such as described above. In accordance with the embodiments of the invention, the squeegee configuration 410 also has a continuous squeegee segment 425 that encircles the spiraling squeegee segment 411, the apertures 426 and 426' and the absorbent element 427. FIG. 4C shows a squeegee configuration 450 with continuous squeegee segment 455 that protrudes from a support structure 451 and encircles one or more apertures 456 and one or more cleaning elements. The one or more apertures 456 are configured for delivering a medium to and/or for drawing a vacuum on a working surface (not shown) while the squeegee segment 455 and the one or more cleaning elements 454 wipe the working surface. The one or more cleaning elements, in accordance with the embodiments of the invention comprise, an absorbent material, a scouring material, an abrasive material, bristles or any combination thereof.

Figure 5A:
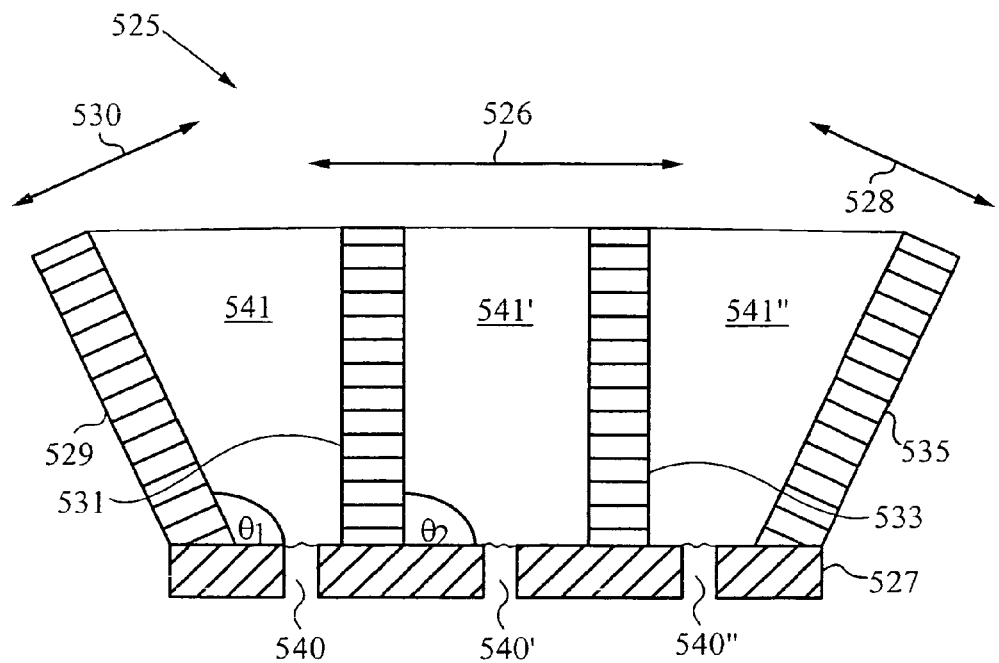
FIGS. 5A-B shows cross sectional views of squeegee configurations absorbent material between squeegee walls, in accordance with the embodiments of the invention.

FIG. 5A illustrates a cross-sectional view of a squeegee configuration 525 with squeegee walls 529, 531, 533 and 535 that protrude from a squeegee support member 527 with a plurality of apertures 540, 540' and 540" flanked or surrounded by the squeegee walls 529, 531, 533 and 535. In accordance with a preferred embodiment of the invention, sections of an absorbent material 541, 541' and 541" are positioned between squeegee walls 529, 531, 533 and 535 and substantially fill the spaces between the squeegee walls 529, 531, 533 and 535. The squeegee walls 529 and 535 can protrude in a squeegee protruding direction that is at an angle θ1 from the squeegee support member 527 and provide for primary squeegee directions in the non-coincident squeegee wiping planes indicated by the arrows 530 and 528, respectively. The angle θ1, can be any angle between 180 and 90 degrees. The squeegees walls 531 and 533 protrude from the squeegee support 527 in a squeegee protruding direction that is at an angle θ2 relative to the squeegee support 527 to provide for a primary squeegee direction in the wiping plane indicated by the arrow 526. Angle θ2 can also be any angle between 90 and 180 degrees that is different from angle θ1 such as to provide primary squeegee directions in a plurality of non-coincident wiping planes 530, 526 and 528. Also, while the section of the absorbent material 541, 541' and 541" are shown here to substantially fill the space between the squeegee walls 529, 531, 533 and 535, it will be clear to one skilled in the art that the absorbent material 541, 541' and 541" can partially fill the spaces between the squeegee walls 529, 531, 533 and 535 and can protrude for the support structure 527 a height that is greater or less than any or all of the squeegee walls 529, 531, 533 and 535.

Figure 5B:
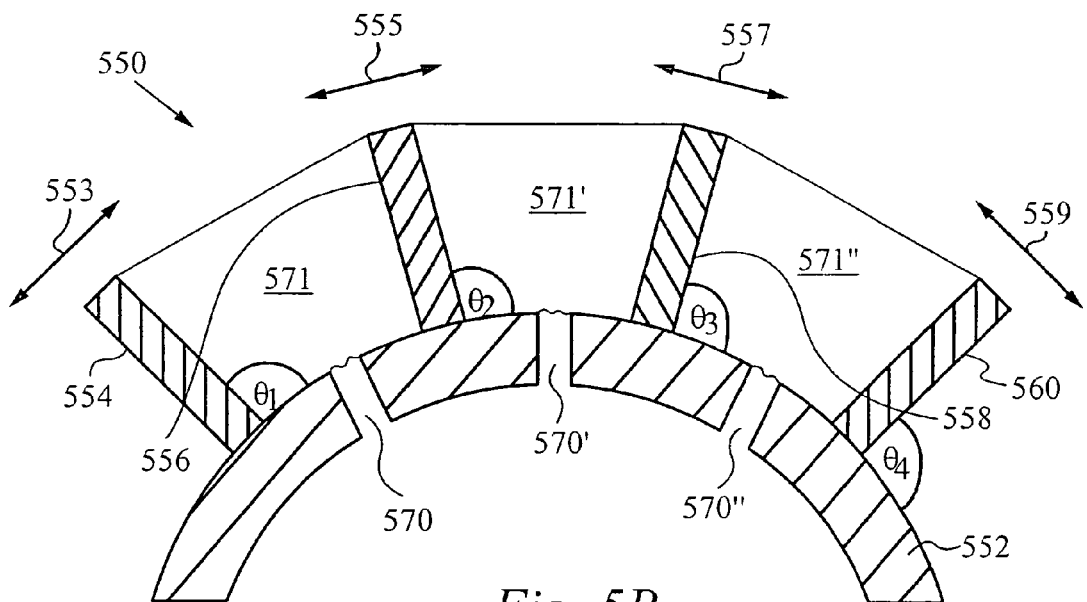

FIG. 5B illustrates a cross-sectional view of an alternative squeegee configuration 550. The squeegee configuration 550 has squeegee walls 554, 556, 558 and 560 that protrude in squeegee protruding directions at the angles θ1, θ2, θ3 and θ4 relative to a contoured support structure 552. The support structure 552 has a plurality of apertures 570, 570' and 570" flanked or surrounded by the squeegee walls 554, 556, 558 and 560. In accordance with a preferred embedment of the invention, sections of an absorbent material 571, 571' and 571" are positioned between squeegee walls 554, 556, 558 and 560 and substantially fill the spaces between the squeegee walls 554, 556, 558 and 560. The squeegee configuration provides primary squeegee direction in the wiping planes indicated by the arrows 553, 555, 557 and 559, respectively. The squeegee walls described in FIGS. 5A-B can belong to individual squeegee segments, continuous squeegees, squeegee networks, squeegee elements with a single terminus end or any combination thereof. Also, while the section of the absorbent material 571, 571' and 571" are shown here to substantially fill the space between the squeegee walls 554, 556, 558 and 560, it will be clear to one skilled in the art that the section of the absorbent material 571, 571' and 571" can partially fill the spaces between the squeegee walls 529, 531, 533 and 535 and can protrude from the support structure 552 to the same or a different height relative to any or all of the squeegee walls 529, 531, 533 and 535.

Figure 6A:
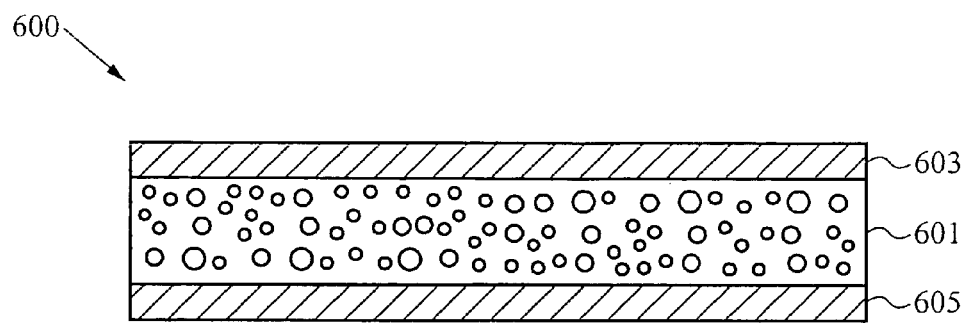
FIG. 6A-E show portions of squeegee configurations with squeegee segments that surround or flank sections of absorbent material, in accordance with the embodiments of the invention
Figure 6B:
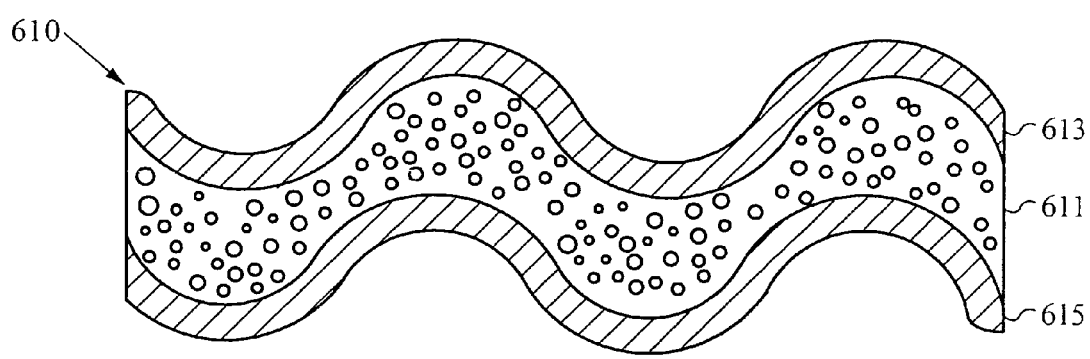
Figure 6C:
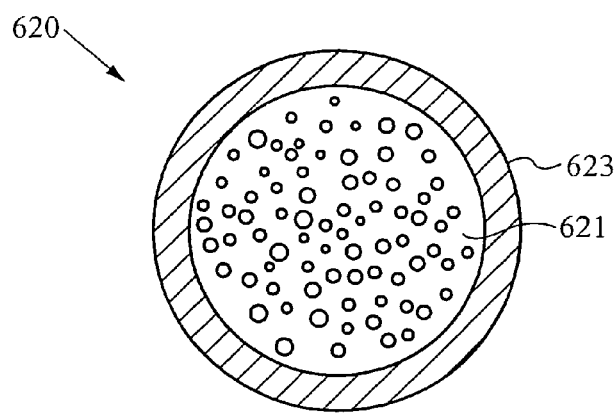
Figure 6D:
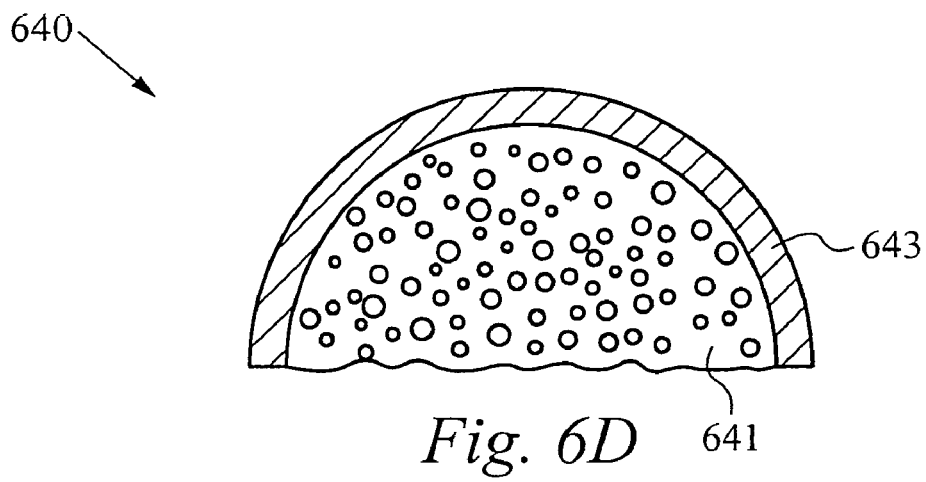
Figure 6E:
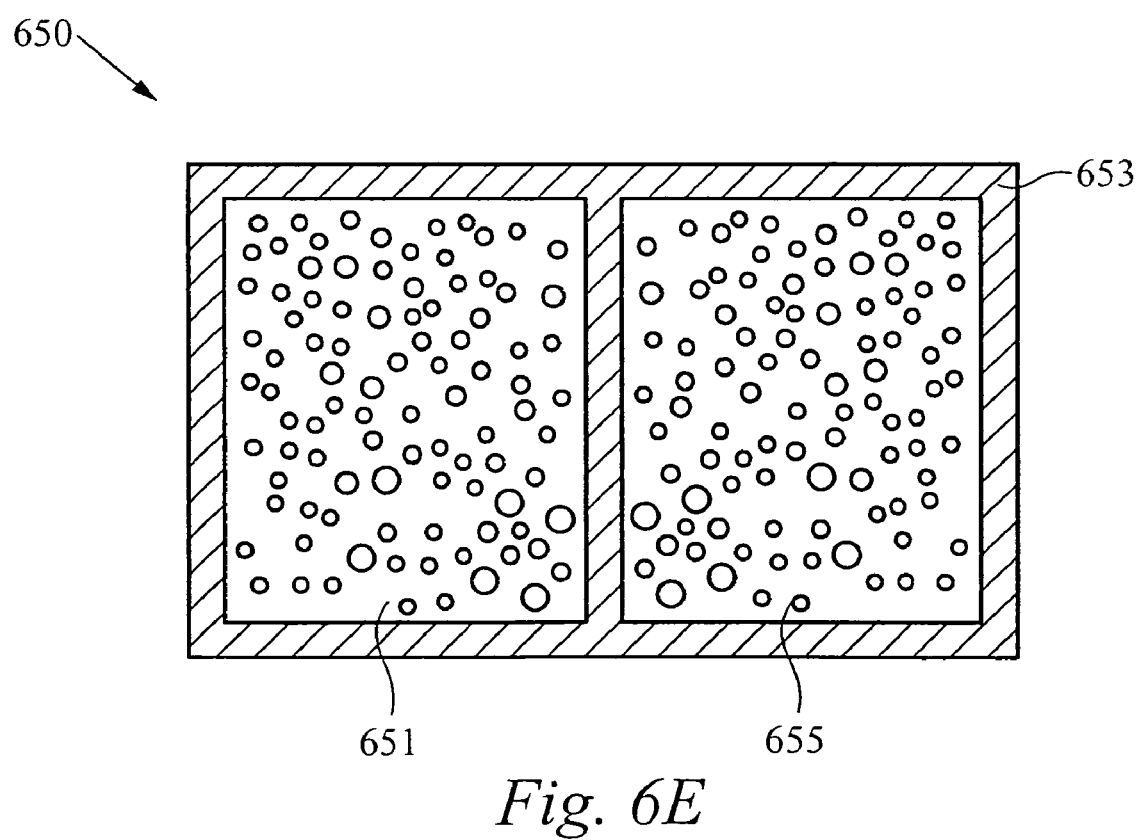

FIG. 6A-E show portions of squeegee configurations with squeegee segments that surround or flank sections of absorbent material. FIG. 6A shows a portion of a squeegee configuration 600 comprising linear squeegee segments 603 and 605 that flank or surround a section of absorbent material 601. FIG. 6B shows a portion of a squeegee configuration 610 comprising curved or wave-like squeegee segments 613 and 615 that flank or surround a section of absorbent material 611. FIG. 6C shows a portion of a squeegee configuration 620 comprising a continuous squeegee segment 623 that flanks or surrounds a section of absorbent material 621. FIG. 6D shows a portion of a squeegee configuration 640 comprising a semi-circle squeegee segment 643 that flanks or surrounds a section of absorbent material 641. FIG. 6E shows a portion of a squeegee configuration 650 comprising a squeegee matrix 653 that flanks or surrounds sections of absorbent material 651 and 655. The FIGS. 6A-E are provide for illustration and it will be clear from the descriptions above and below that portions of squeegee configurations described with reference to FIG. 6A-E can be combined in any number of different ways. Further, squeegee segments can be coupled to a support structure with apertures, as described previously, or alternatively can be simply coupled to an adsorbent material without a support structure such that wiping edges of the squeegee segments and absorbent material positioned therebetween are accessible for treating a working surface from more than one side of the device.

Figure 7A:
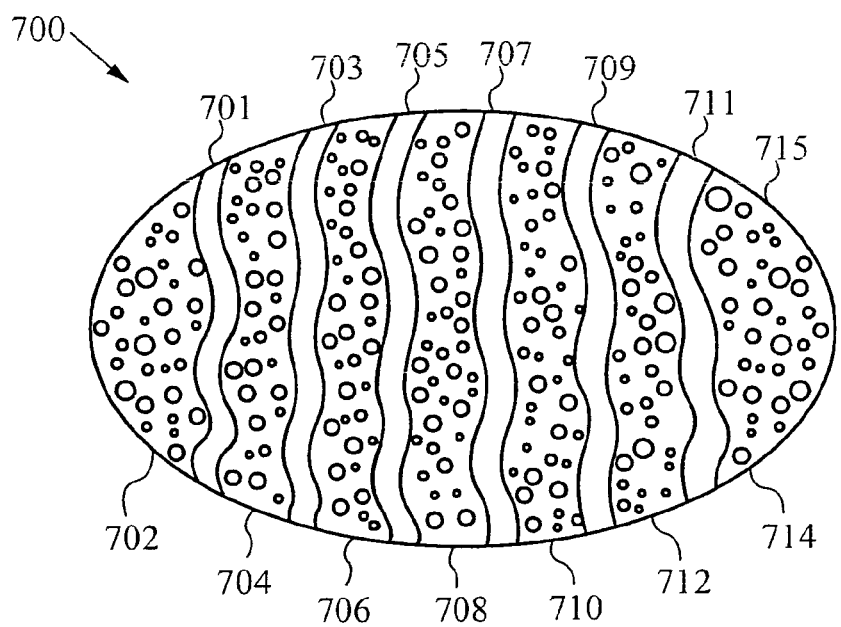
FIG. 7A-C show an applicator or cleaning device, in accordance with the embodiments of the invention.
Figure 7B:
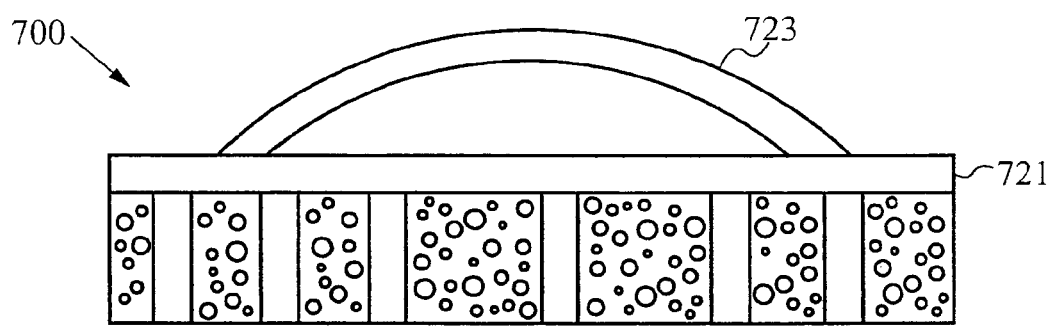
Figure 7C:
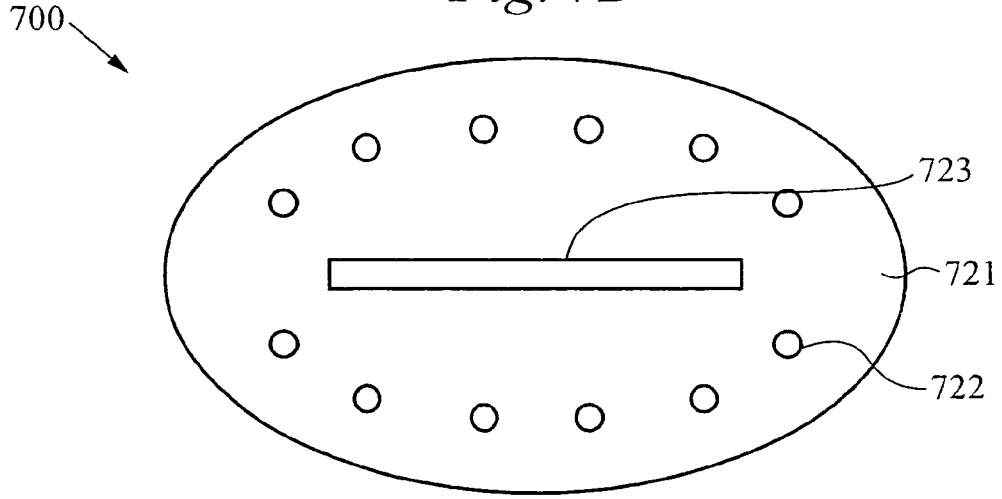

FIG. 7A-C show an applicator or cleaning device 700, in accordance with the embodiments of the invention. Referring to FIG. 7A, the applicator or cleaning device 700 comprises a plurality of squeegee segments 701, 703, 705, 707, 709 and 711 with sections of an absorbent material 702, 704, 706, 708, 710, 712 and 714 positioned in an alternating fashion between the squeegee segments 701, 703, 705, 707, 709 and 711. Referring to the FIGS. 7B-C, the applicator or cleaning device 700 can comprise a support structure 721 with apertures 722, such that water and/or other fluids can be applied to the sections of an absorbent material 702, 704, 706, 708, 710, 712 and 714 through the apertures 722. The applicator or cleaning device 700 can also have a loop handle 723 as shown and/or an extended handle that protrudes outward from the support structure 721. As stated above with reference to FIGS. 2A-E, the applicator or cleaning device 700 does not require a support structure or a handle. Where the applicator or cleaning device 700 does not have a support structure, the top and bottom sides of the applicator or cleaning device 700 will appear similar and both can be used to treat or clean a working surface.

Figure 8:
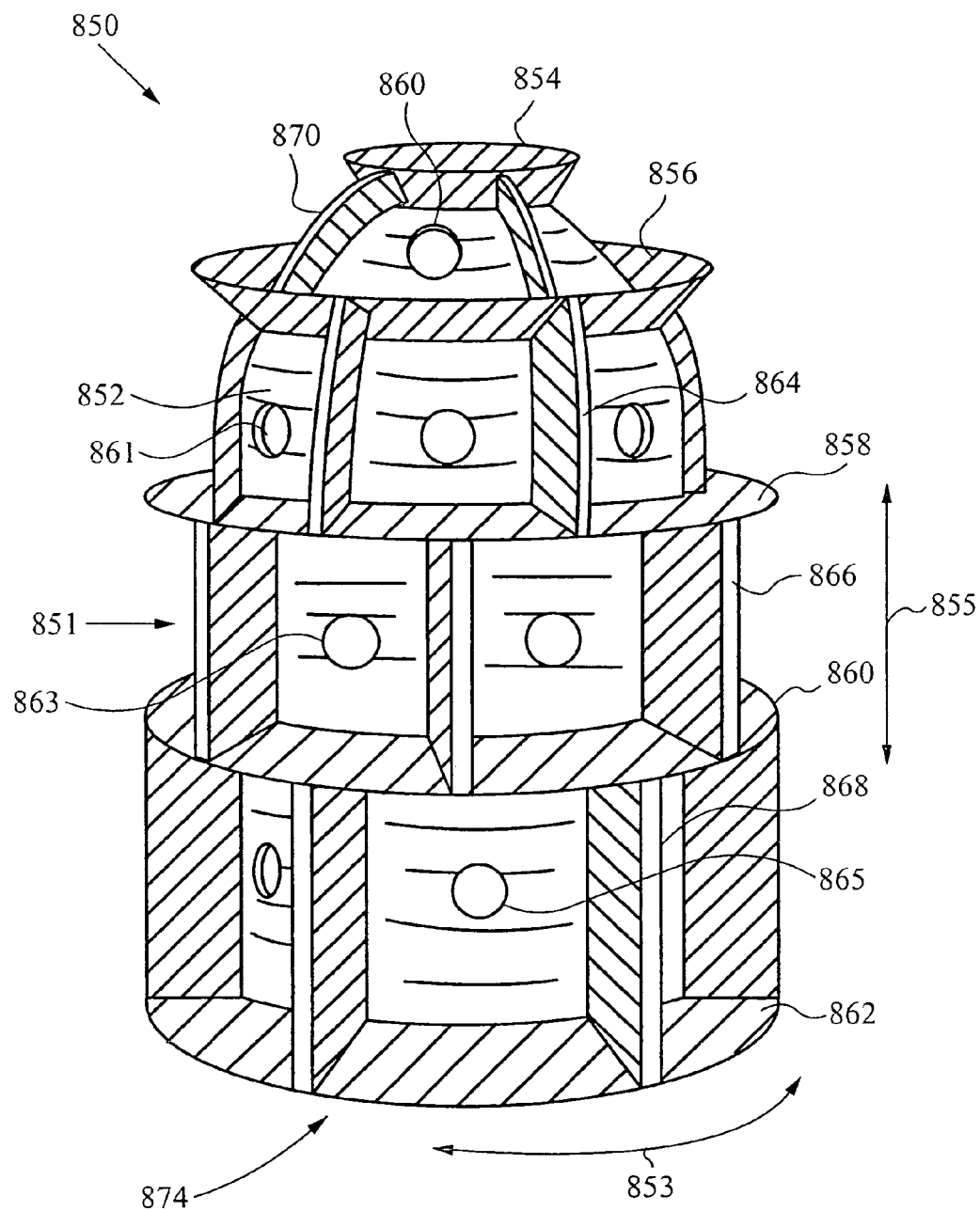
FIG. 8 shows a perspective view of a cleaning head that is particularly useful for cleaning inner surfaces of vessels and cavities, in accordance with the embodiments of the invention.

FIG. 8 shows a perspective view 850 of a cleaning portion 851 that is particularly useful for cleaning inner surfaces of vessels and cavities. The cleaning head 851 has substantially circular squeegee segments 858, 860 and 862 protruding from the sides of an elongated tubular squeegee support structure 852. Several linear squeegee segments 868, 866 and 864 also protrude from the sides of the elongated tubular squeegee support 852 and extend in an elongated direction 855. The linear squeegee segments 868, 866 and 864 are preferably connected to the squeegee walls of the substantially circular squeegee segments 858, 860 and 862. Substantially circular squeegee segments 854 and 856 and linear squeegee segments 864 and 870 also protrude from the curved top portion 852 of the elongated squeegee support. The rotary squeegee cleaning portion 851 has an attachment portion 874 for attaching the rotary squeegee cleaning portion 851 to a rotary device (not shown) in order to provide squeegee cleaning action in the rotary direction 853. In accordance with the embodiments of the support structure 852 comprises apertures 860, 861, 863 and 865 for delivering a medium to or drawing a vacuum on a working surface of a vessel. The cleaning head 750 can also include an absorbent material that is configured to be positioned within squeegee cavities formed by the squeegee segments 858, 860, 862, 864, 866, 868, and 870.

Figure 9A:
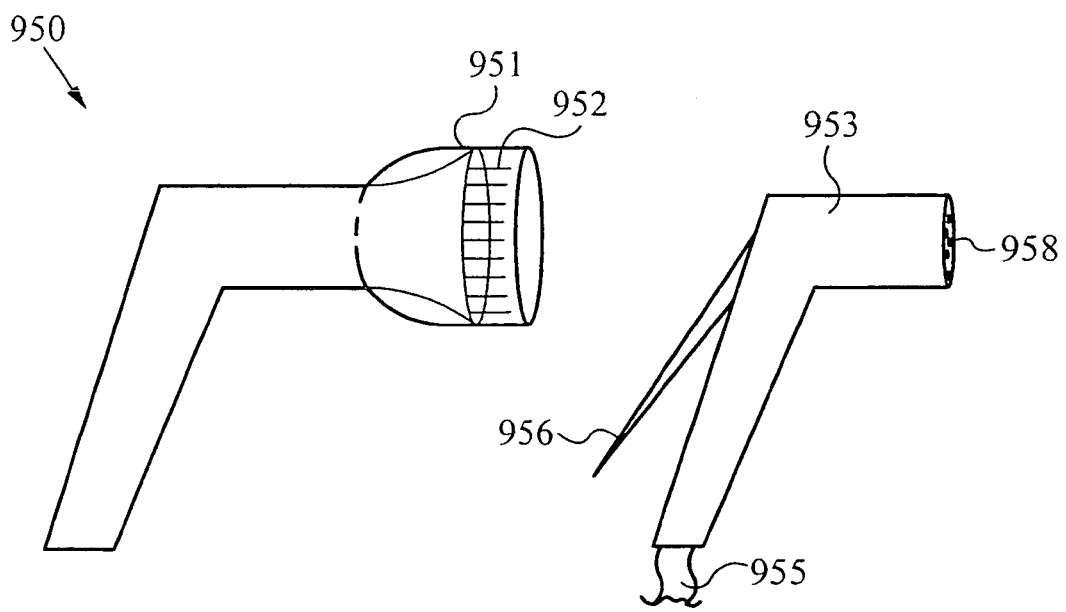
FIG. 9A-D show an apparatus with a squeegee configuration for coupling to a spray nozzle, in accordance with the embodiments of the invention.
Figure 9B:
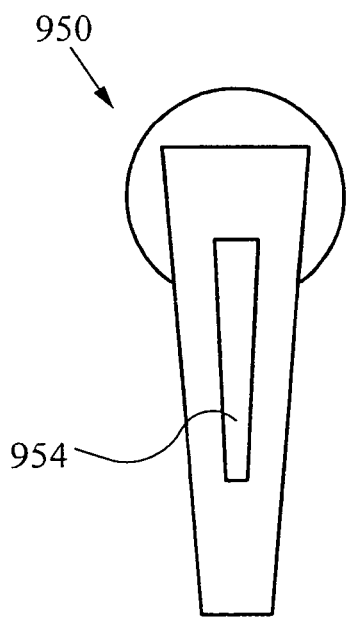
Figure 9C:
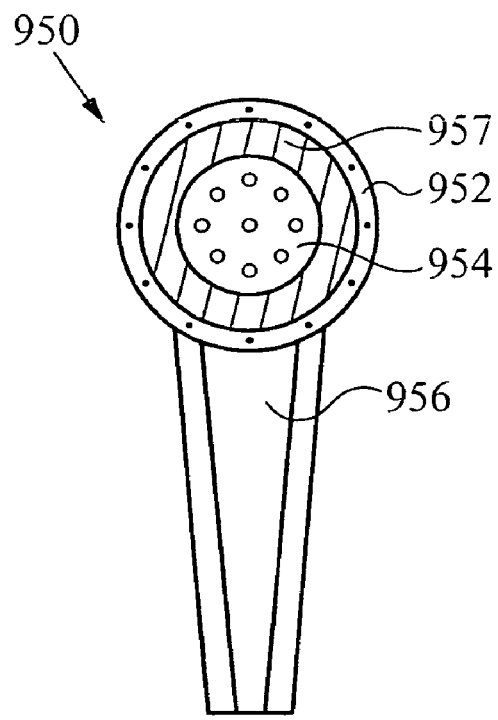
Figure 9D:
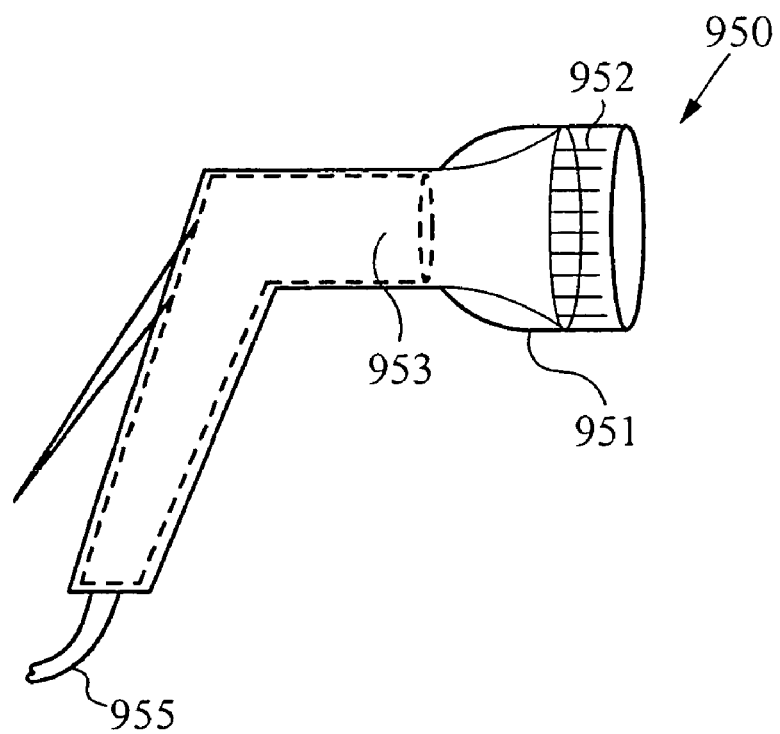

FIGS. 9A-D show an apparatus 950, in accordance with the embodiments of the invention. The apparatus 950 is configured to couple to a spray nozzle 953, such as shown in FIG. 9D. The spray nozzle 953 can be configured to spray or deliver a liquid medium from a medium source (not shown) through a spraying end 954 of the spray nozzle 953. The spraying end 954 of the spray nozzle 953 can include a plurality apertures for spraying the solution medium onto a working surface (not shown). For example, the spray nozzle 953 is a kitchen sink spray nozzle connected to a water source through a hose 955 and is configured to spray water. The apparatus 950 comprises at least one squeegee element 951, such as a continuous squeegee element that surrounds the spraying end 954 of the spray nozzle 953. It will be clear from the descriptions above, that the apparatus 950 can be configured to include any number of squeegee elements with any number of different geometries, including linear squeegees, curved squeegees, wave-like squeegees, networks of squeegees and combinations thereof, such as described. The apparatus 950 can also have a slotted feature 954 for allowing access to an actuator lever 956 on the spray nozzle 953 or alternatively can have a actuator feature anywhere that is appropriate on the body portion 954 of the apparatus 950 that is configured to actuate a flow of the liquid medium from the medium source through the spraying end 958 of the spray nozzle 953. In addition the squeegee segment 951, the apparatus 950 can include bristles or bristle tufts 952 and/or a scouring or abrasive element 957 that can also surround the spraying end 958 of the spray nozzle 953. In use, the spray nozzle 953 sprays or delivers the liquid medium onto the working surface, such as a dish, while the squeegee segment 951, the bristle or bristle tufts 952 and/or scouring or abrasive element 957 is used to wipe and/or scrub the working surface.

Figure 10:
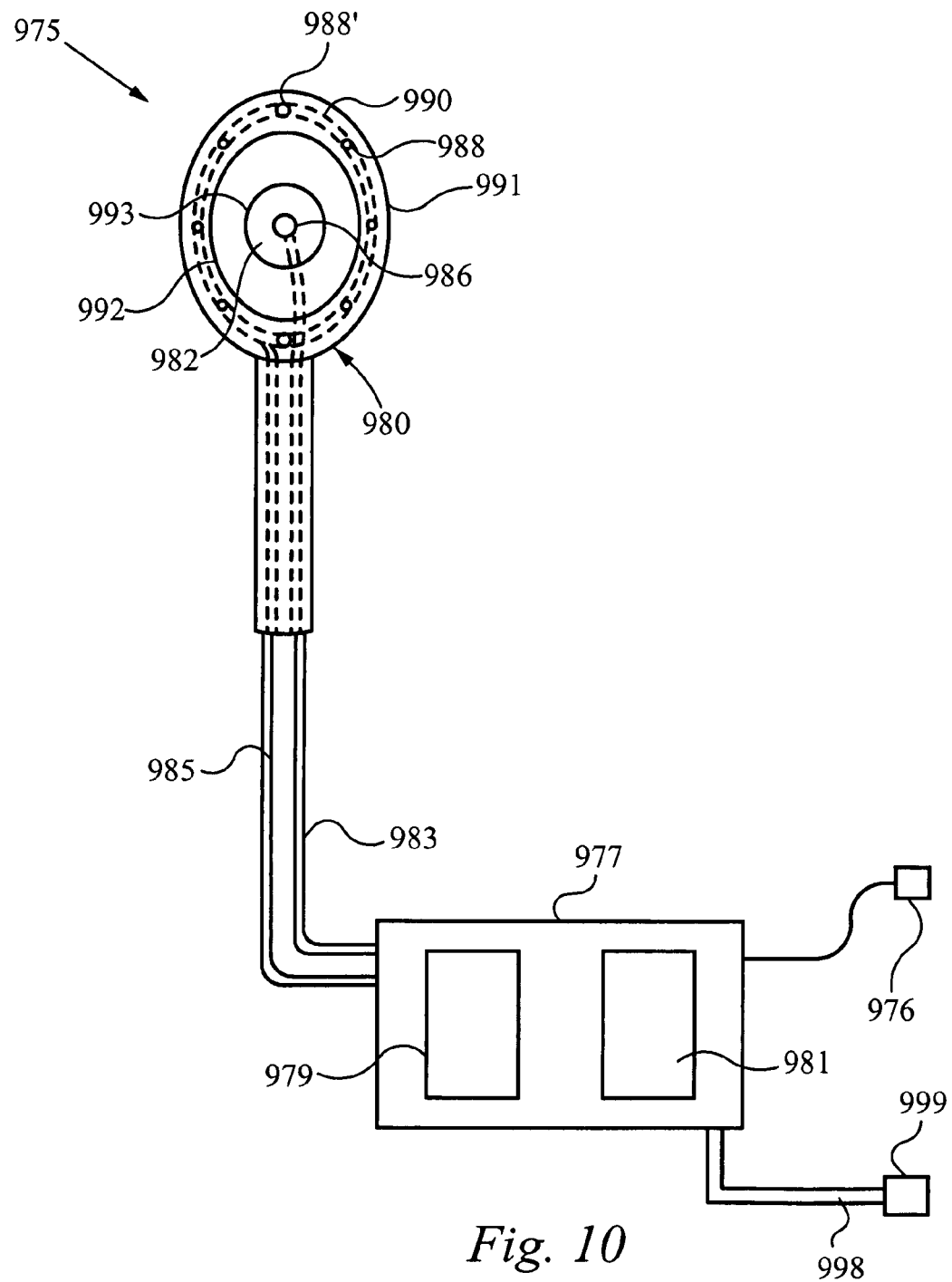
FIG. 10 shows a system with a squeegee configuration for delivering a vacuum and one or more solution to a working surface, in accordance with the embodiments of the invention.

FIG. 10 shows a schematic diagram of a system 975, in accordance with the embodiments of the invention. The system 975 includes an applicator head 980 that is configured with squeegee segments 991, 992, and 993 that form one or more channels 990 and/or compartments 982. Positioned within the channels 990 and/or compartments 982, are a first set of apertures 988 and 988' and a second set of apertures 986. The first set of apertures 988 and 988' are coupled to a first delivery line 985 that is configured to draw a vacuum and/or deliver a first solution from a first source 979 through the first delivery line 985 and the second set of apertures 986 coupled to a second delivery line 983 and are configured to draw a vacuum and/or deliver a second solution from a second source 981 through the second delivery line 983. The system 975 can include a housing unit 977 for housing the first source 979, the second source 981 and pumps, reservoirs, valves, hoses and/or electronics (not shown) to control the draw of the vacuum and/or the flow of fluids to the applicator head 980. The system 975 can include a power cord 998 for coupling to a suitable power source 999, such an electrical outlet receptacle. The system 975 can also include a controller unit 976 which can include a computer and input panel (not shown) for controlling the operation the system 975 and/or for programming system 975 to delivery one or more fluids and/or draw of a vacuum according to a preferred mode of operation. Preferably, the system 975 can operate with one of the sets of the apertures 982 are configured to deliver one or more fluid to a working surface while the other of the sets of apertures 988 and 988' are configured to draw a vacuum on the working surface, wherein the one or more fluids can be applied the working surface and remove from the working surface in single mode or operation.

Figure 11:
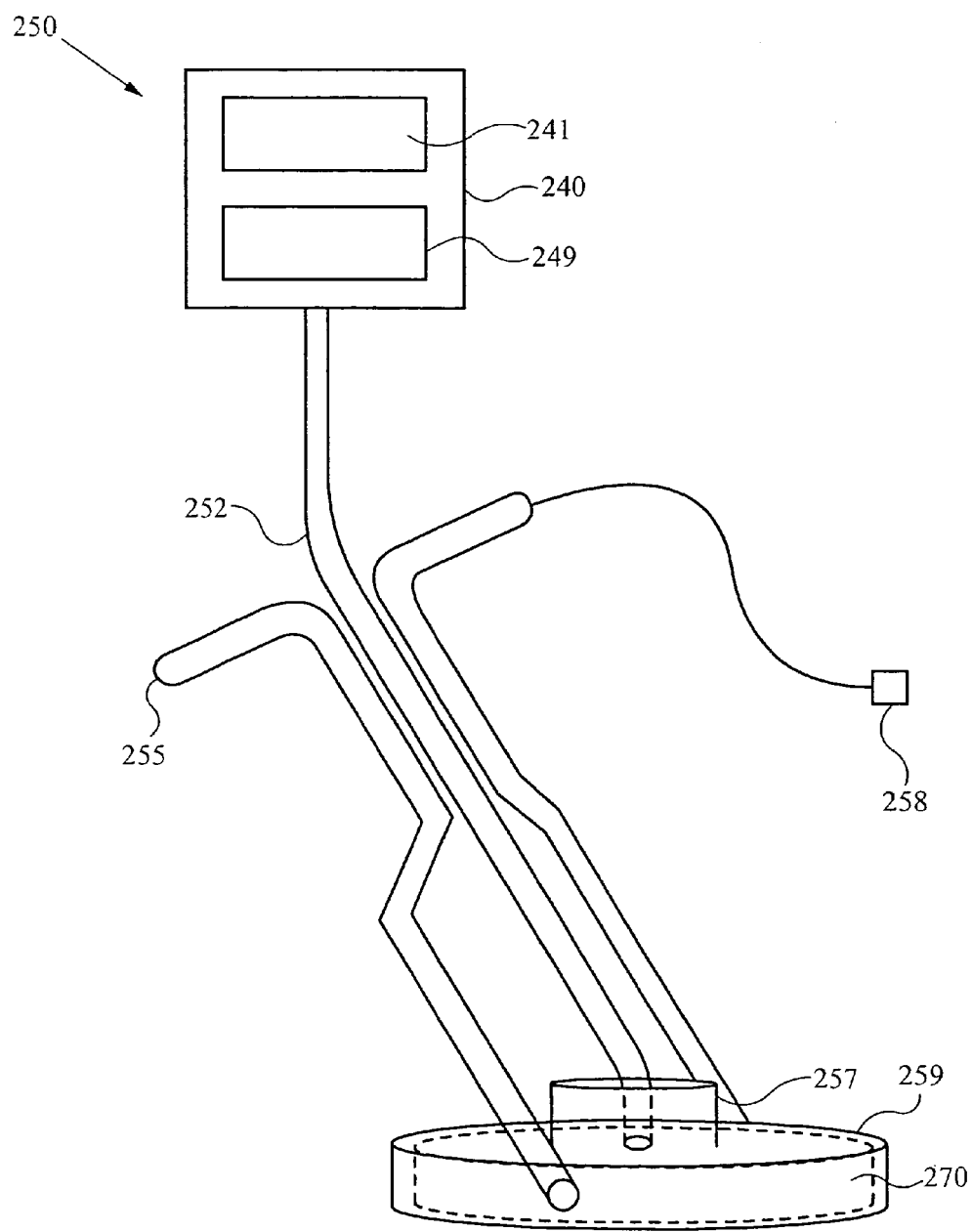
FIG. 11 shows a system 250 with a motorized squeegee configuration, in accordance with a further embodiments of the invention.

FIG. 11 shows a system 250 in accordance with a further embodiments of the invention. The system 250 comprises an applicator head 259 and a motor unit 257 configured to rotate, agitate or otherwise move a squeegee configuration 270 with one or more squeegee segments and apertures as described above. The system 250 includes a solution and/or vacuum delivery unit 240, which draws a vacuum on a working surface (not shown) and or delivers one or more liquids to the working surface through the squeegee configuration 270 from one or more of the sources 241 and 249. The system 250 can include a handle section 255 and plumbing 252 for coupling the solution and/or vacuum delivery unit 240 to the squeegee applicator head 259 and means for coupling 258 the system 250 to a power source. The system 250 can be configured to clean or polish any number working surfaces large or small including such working surfaces as floors.

It will be clear to one skilled in the art from the description above that top wiping edges and side wiping edges of the squeegee element and segments described can be contoured, to corrugated, curved, pointed, angled, tapered or otherwise textured. While embodiments have been described with bristles, bristles are not required. Further, any number of the features described above can be combined in different ways to provide other squeegee configurations that are considered to be within the scope of the invention. It is also understood that an abrasive material can be integral with the squeegee segments or attached to the walls or edges of squeegees as required for the application at hand. Further, that the absorbent elements utilized in the squeegee configurations can be formed from systematic materials, such as polyurethane, plastics, rubber other polymeric materials, natural materials, such as natural sponge, woven materials, such as cotton and/ or other woven materials. The scouring or abrasive elements utilized in the squeegee configuration can be formed from metal, plastic, composite materials or any combination thereof. Also, walls of squeegee segments, while generally shown as uniform herein, can vary in thickness in either an elongated direction, in a protruding direction or both. Accordingly, the proceeding preferred embodiments of the invention is set forth without any loss of generality to, and without imposing limitations upon, the claimed invention.

What is claimed is:

1. A device comprising a cleaning head:
   a) squeegee segments with protruding squeegee walls that form four or more separate and discrete channels; and
   b) an absorbent material positioned between the protruding squeegee walls of the squeegee segments and filling at least a portion of each of the four or more separate and discrete channels, wherein wiping edges of the squeegee segments separate the absorbent material within the four or more separate and discrete channels and, wherein the squeegee segments and the absorbent material are configured to treat a working surface; and
   c) a support structure with apertures that are positioned between the squeegee segments and within the squeegee four or more separate and discrete channels.

2. The device of claim 1, wherein the support structure is curved or contoured.

3. The device of claim 1, further comprises a handle coupled to the support structure.

4. The device of claim 1, wherein the squeegee configuration is configured to couple to a liquid source for delivering a liquid.

5. The device of claim 1, wherein the squeegee configuration is configured to couple to a vacuum source for drawing a vacuum.

* * * * *